(12) United States Patent
Canham et al.

(10) Patent No.: US 7,029,986 B2
(45) Date of Patent: Apr. 18, 2006

(54) BONDED PRODUCTS AND METHODS OF FABRICATION THEREFOR

(75) Inventors: Leigh T Canham, Worcs (GB); Christopher L Reeves, Worcs (GB)

(73) Assignee: pSiMedia Limited, Malvern (GB)

( * ) Notice: Subject to any disclaimer, the term of this patent is extended or adjusted under 35 U.S.C. 154(b) by 0 days.

(21) Appl. No.: 10/978,479

(22) Filed: Nov. 2, 2004

(65) Prior Publication Data

US 2005/0116247 A1 Jun. 2, 2005

Related U.S. Application Data

(62) Division of application No. 10/168,146, filed as application No. PCT/GB00/04552 on Nov. 30, 2000, now Pat. No. 6,832,716.

(30) Foreign Application Priority Data

Dec. 15, 1999 (GB) .................................. 9929521

(51) Int. Cl.
*H01L 21/76* (2006.01)
(52) U.S. Cl. ...................... 438/406; 438/455; 438/407; 438/409
(58) Field of Classification Search ...................... None
See application file for complete search history.

(56) References Cited

U.S. PATENT DOCUMENTS

| | | | |
|---|---|---|---|
| 5,453,394 A | * | 9/1995 | Yonehara et al. ........... 438/455 |
| 5,536,361 A | * | 7/1996 | Kondo et al. ............... 438/492 |
| 5,869,387 A | * | 2/1999 | Sato et al. ................... 438/459 |
| 6,017,773 A | | 1/2000 | Fauchet et al. |
| 6,064,149 A | | 5/2000 | Raina |
| 6,121,112 A | * | 9/2000 | Sakaguchi et al. .......... 438/406 |
| 6,143,629 A | * | 11/2000 | Sato ............................ 438/455 |
| 6,399,177 B1 | | 6/2002 | Fonash et al. |

FOREIGN PATENT DOCUMENTS

| | | |
|---|---|---|
| DE | 43 42 527 A | 6/1995 |
| DE | 196 21 144 A | 11/1996 |
| EP | 0 461 481 A | 12/1991 |
| GB | 2 317 885 A | 4/1998 |
| GB | 2 337 255 A | 11/1999 |
| JP | 06-340477 | 12/1994 |
| WO | 96/06700 A | 3/1996 |

* cited by examiner

*Primary Examiner*—Luan Thai
(74) *Attorney, Agent, or Firm*—Nixon & Vanderhye P.C.

(57) ABSTRACT

This invention relates to a method of fabricating a bonded product comprising at least two components that are bonded together, the method comprising the steps of: a) bringing the components together; and b) heating the components; wherein at least one of the components comprises a nanomaterial and wherein steps (a) and (b) are performed in such a manner that the components are bonded together by heating at least part of the nanomaterial. The method allows the components to be welded together at lower temperatures than for prior art methods. The method also provides a more reliable form of bonding and improves the strength of the bond formed.

10 Claims, 6 Drawing Sheets

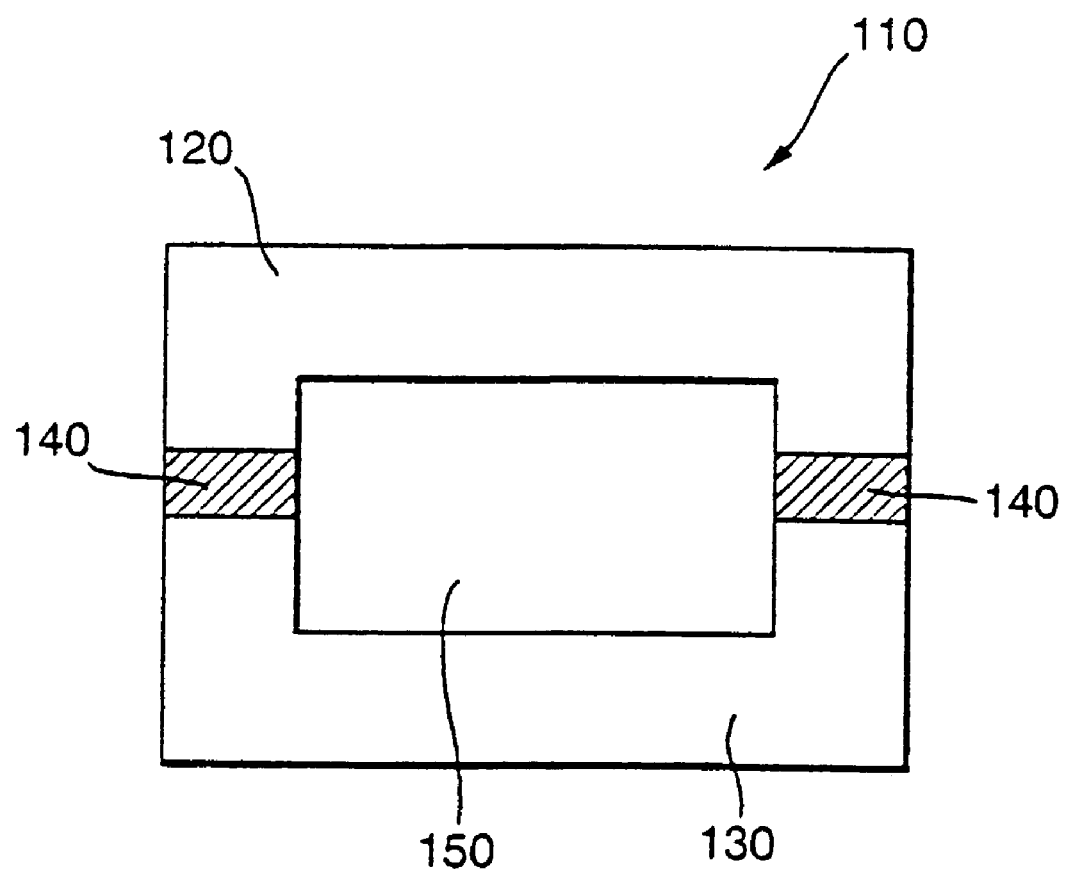

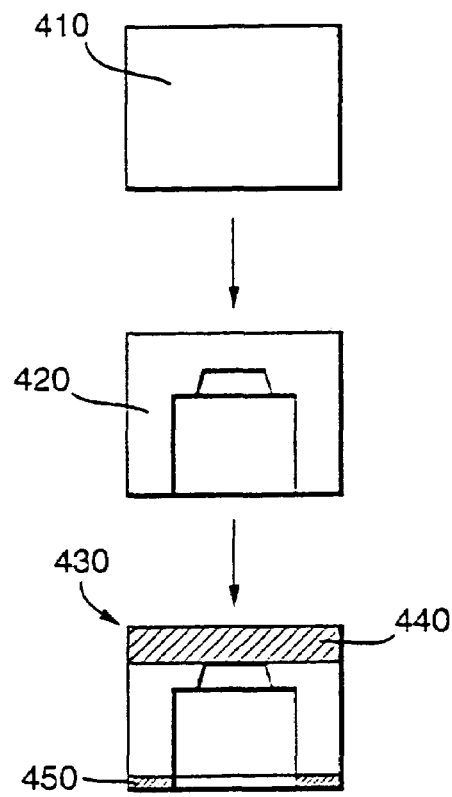
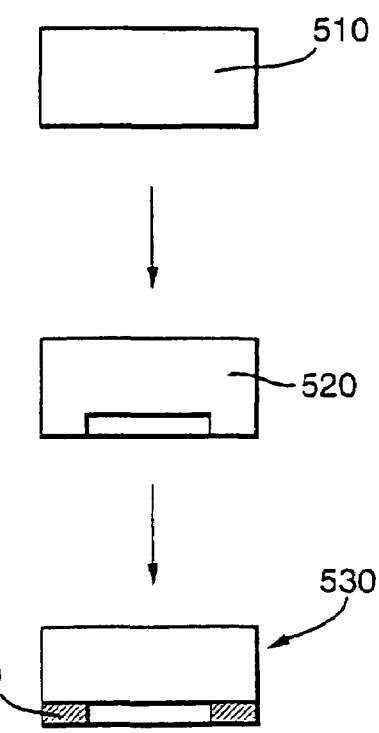
Fig.3a.  Fig.3b.
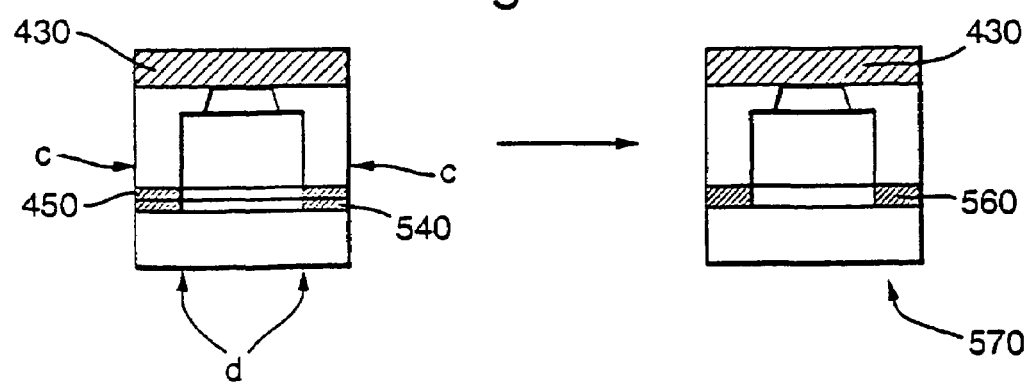
Fig.3c.

Fig.5.
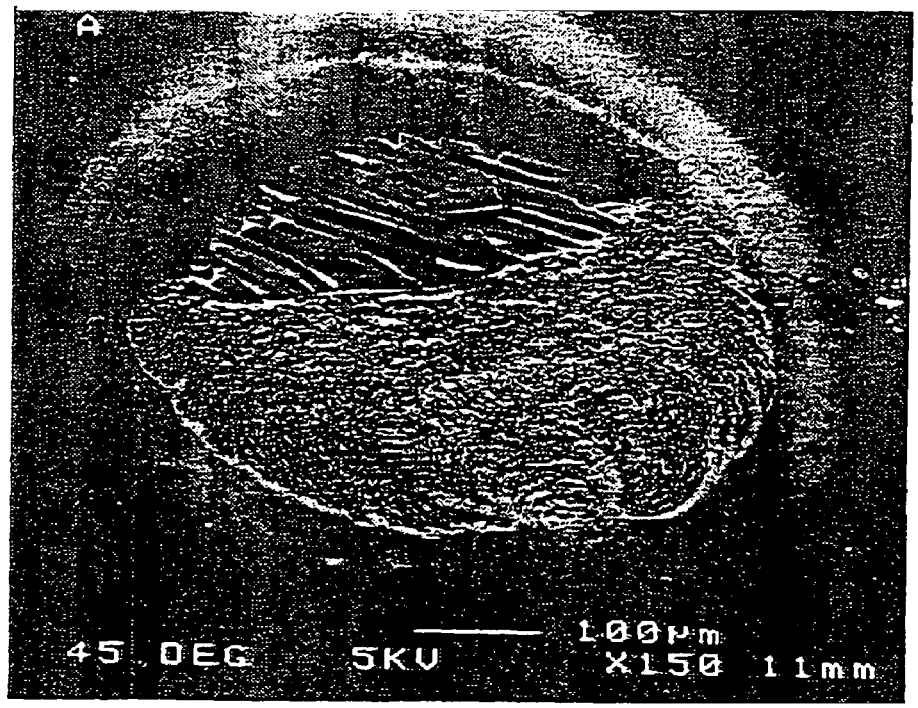
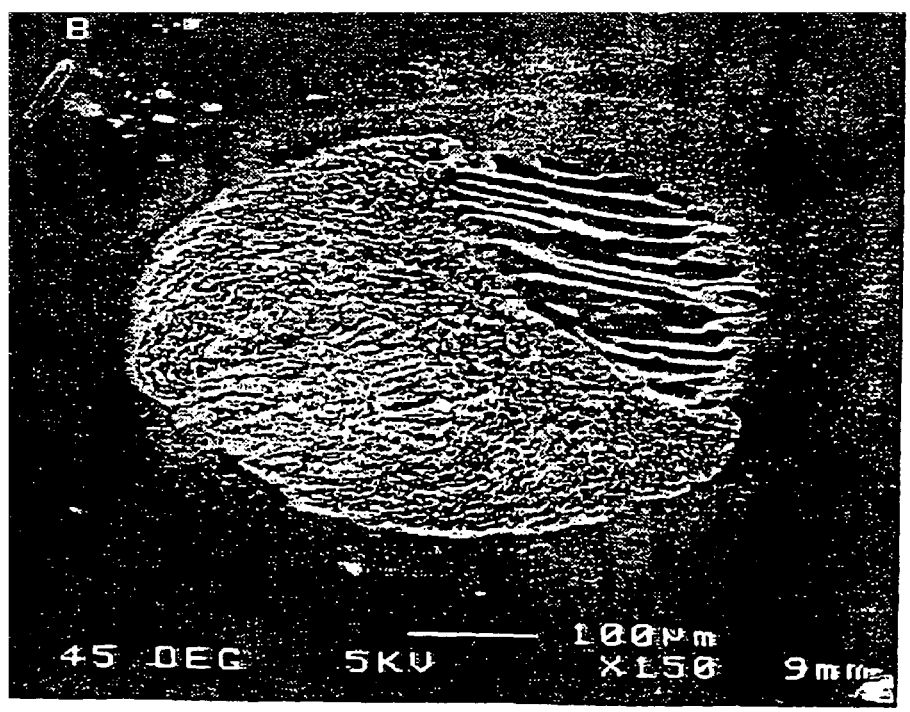

BONDED PRODUCTS AND METHODS OF FABRICATION THEREFOR

This application is a divisional of application Ser. No. 10/168,146 filed Jun. 25, 2002, now U.S. Pat. No. 6,832,716, which in turn is the US national phase of international application PCT/GB00/04552 filed 30 Nov. 2000, which designated the US.

This invention relates to bonded products, to methods of fabrication therefor and to bonding materials for use in such methods.

There are a number of ways in which bonded products, comprising components that have been bonded together, can be fabricated. For example the components may be bonded by welding, soldering, or by the use of an adhesive. Welding involves melting the components so that they bond together. Alternatively one of the components may comprise a bonding material such as an adhesive or a solder. For example if one of the components is a solder, then this component may be melted to form a bond between the other components. Welding technology has a particularly important role to play in the field of silicon microfabrication, which is now an established manufacturing technique for producing micromechanical devices. The technique provides for batch-processing miniaturised silicon devices of great diversity, for example micropumps, accelerometers, pressure sensors and microactuators. Many micromechanical devices comprise several micromachined components, each component being formed from bulk crystalline silicon. Assembly of such devices often involves joining parts of silicon wafers, comprising bulk crystalline silicon, together in a spatially precise, clean-room compatible manner. Silicon wafer bonding technology is therefore an important aspect of device manufacture, for example to ensure that assembled and packaged devices maintain operational reliability.

Many microfabricated devices incorporate electronic circuits, for example circuits to perform in-situ signal processing or provide drive signals for operating the devices. For many applications, the circuits have to be protected from an environment in which the devices are to be used. Such protection is conventionally achieved by encapsulating the devices in respective packages which are sealed by forming a package hermetic seal under vacuum conditions.

There are presently two dominant conventional bonding processes for bonding silicon-based components together, namely "direct bonding" and "anodic bonding". In direct bonding two or more components, comprising bulk crystalline silicon, are assembled so that the surfaces to be bonded are in contact with each other. Heat is then applied to the assemble components so that the associated surfaces form a bond. For many applications temperatures approaching 1000° C. are required before the bond can be formed. In contrast, anodic bonding is often employed to form bonds between silicon and silica components. It involves mating a polished surface of a silicon component to that of a silica component to be joined together and then applying a high electric field across an interface formed where the surfaces mate, thereby mutually polarising the surfaces to form an electrostatic bond at the interface. During anodic bonding, heating the components enhances bonding strength achievable therebetween.

Both of these conventional bonding processes described above suffer a disadvantage that the components need to be heated in their entirety for direct bonding and high electric field strengths are required for anodic bonding. In many situations, electronic circuits are not capable of withstanding annealing temperatures used in direct bonding and high electric field strengths applied in anodic bonding; aluminium interconnections cannot withstand temperatures in excess of 450° C. for example, whereas high electric fields can damage or ionise silicon nitride or silicon dioxide dielectric layers for example. Moreover, bonding strengths provided by direct bonding and anodic bonding are insufficient in certain device applications where high reliability is paramount, for example for micromachined accelerometers which are to be subjected to peak acceleration forces in excess of 25000 g.

A demanding application for encapsulated microfabricated micromachined devices is in biological environments where there are, for example, corrosive biological body fluids. Providing protection from such fluids is particularly important for safety-critical applications where device failure cannot be tolerated, for example in amicrofabricated pace maker arranged to provide heart stimulation. A conventional approach for protecting electronic circuits for use in biological systems is to encapsulate them within welded titanium boxes, titanium being a biocompatible material which biological systems accept by forming a layer of cells thereonto which thereby avoids biological rejection problems. This conventional approach was developed in the 1960's and 1970's where, even in that era, hermetic seals were of a sufficiently high quality to realise a remarkably low failure rate; J Buffet in an article in Medical Progress in Technology 1975 Vol. 3 page 133 reported a failure rate of 13 out of 5800 implanted pacemakers encapsulated within welded titanium enclosures over a three year period.

Although adoption of welded titanium enclosures has been acceptable to health care industries generally, the enclosures tend to be bulky which excludes their use in situations where miniaturisation is of prime importance, for example for incorporation into an human inner ear region to stimulate nerve endings therein. In a publication Advanced Materials 7, 1995 pp. 1033, it is disclosed that silicon is potentially usable, instead of titanium, for enclosures for use in biological systems. Bonded silicon microfabricated micromachined components can thereby not only form devices suitable for use in biological environments but also provide their own encapsulation. However, especially in safety critical applications, seals provided between bonded silicon components must be extremely reliable. Conventional bonding techniques, for example direct bonding and anodic bonding, are often insufficiently reliable for safety critical applications. There is therefore a need for a more reliable bonding technique for bonding together semiconductor components.

Silicon welding has been previously investigated during the 1960's and 1970's and is reported in an article by H Foll and DG Ast in the proceedings of the Ninth International Conference Electron Microscopy, 1978, pp. 428–429. It was quickly abandoned as a reliable process for bonding silicon components because:

(a) welding of silicon components requires them to be heated to an elevated temperature, namely bulk crystalline silicon has a melting point temperature of 1414° C. which means that silicon components to be bonded by conventional silicon welding have to be heated to this temperature; such a high melting point is incompatible with other microcircuit parts, for example aluminium metallisation in an integrated circuit cannot withstand temperatures in excess of 450° C.;
 (b) silicon is a brittle material and exhibits a high thermal budget for making it fuse during welding; this greatly increases likelihood of fracture from thermally induced stresses.

It has been reported, by Goldstein in Appl. Phys. A62, p 33–7 (1996), that nanocrystals of silicon, comprising porous silicon, melt at lower temperatures than bulk crystalline silicon. Melting temperatures as low as 200° C., for 4 nm diameter nanocrystals of silicon have been reported, which compares with melting temperatures of 1414 for bulk crystalline silicon. Porous silicon may be fabricated by the chemical dissolution of bulk crystalline silicon as described by LT Canham in Appl. Phys. Lett. Vol 57, p1046 (1990). Provided the pores are sufficiently closely spaced, nanocrystalline silicon can be formed by this technique.

The following items of prior art are relevant to this invention: U.S. Pat. No. 5,628,848, WO 9606700, EP 0461 481 A2, GB 2337255, and GB 2317885. U.S. Pat. No. 5,628,848 relates to the formation of multilayer structures that are sintered together to form a strong bond between the layers. The starting materials for the layers are in the form of powders. WO 9606700 relates to the fabrication of nanoscale particles. The invention also relates to the use of nanoscale particles to join components together. EP 0461481 A2 relates to the use of nanocrystalline material in welding ceramic components together. GB 2337255 and GB 2317885 relate to the use of silicon for biological and medical application.

It is an objective of the invention to provide new bonded products and methods for fabricating such products that reduce the above mentioned problems. It is a further objective of the invention to provide new bonding materials for use in bonding methods.

According to a first aspect, the invention provides a method of fabricating a bonded product comprising at least two components that are bonded together, the method comprising the steps of:

(a) bringing the components together; and
(b) heating the components;

wherein at least one of the components comprises a nanomaterial and wherein steps (a) and (b) are performed in such a manner that the components are bonded together by heating at least part of the nanomaterial.

Step (b) may be performed prior to, during, or after step (a). Step (a) may comprise the step of abutting each component with the or at least one of the components.

One of the components may comprise all of the nanomaterial. Alternatively each component may comprise nanomaterial.

The method may be used to weld or to solder the components together.

The method provides the benefit that the components can be welded together at a lower bonding temperature compared to conventional bonding techniques. This reduces the chances of fracture from thermally induced stresses.

For the purposes of the invention, a nanomaterial is defined as a material comprising wires or particles having at least one dimension in a range of 1 nm to 20 nm. The nanomaterial may comprise a nanocrystalline material; the nanocrystalline material comprising crystals having a smallest dimension in the range 1 nm to 20 nm.

Preferably the nanomaterial comprises wires or particles having a smallest dimension in a range in which fusion temperatures of nanocrystals of the material are lower than corresponding bulk crystalline material.

Advantageously at least one of the components comprises a semiconducting material; more preferably at least one of the components comprises silicon; yet more preferably at least one of the components comprises bulk crystalline silicon.

Preferably at least one of the components comprises a semiconducting material; more preferably at least one of the components comprises silicon.

Advantageously the nanomaterial comprises a semiconducting material, more preferably the nanomaterial comprises silicon; yet more preferably the silicon comprises porous silicon; even more preferably the porous silicon has a porosity in the range 30% to 90%.

Preferably the method further comprises the step of forming at least one of the components by: (i) taking a sample of silicon, and (ii) anodising at least part of said silicon to form porous silicon.

In this way porous silicon may be formed on the surface of a component to be bonded. The porous silicon is, at least initially, integral with the silicon from which it is formed. The attachment of the porous silicon to a component, or the rest of a component, assists in positioning the nanomaterial for bonding.

Advantageously step (b) comprises the step of passing an electric current through at least part of the nanomaterial; more preferably step (b) comprises the step of passing an electric current through at least part of the nanomaterial for a period between 20 and 80 seconds; yet more preferably step (b) comprises the step of passing an electric current through the nanomaterial and the or at least two of the components.

The passage of an electric current allows heat to be applied at a particular location. Heating occurs preferentially at the nanomaterial, due to its relatively high electric resistance, and not in the surrounding region. The use of two electrodes may further restrict current flow to the region between the electrodes. The use of a semiconducting material, as opposed to an insulator, opens the way for such electrical heating.

Porous silicon exhibits lower thermal conductivity than bulk crystalline silicon. Bulk silicon has a thermal conductivity of 150 W m$^{-1}$ K$^{-1}$, whereas porous silicon exhibits thermal conductivities in a range of 140 W m$^{-1}$ K$^{-1}$ to below 1 W m$^{-1}$ K$^{-1}$ depending upon porosity and associated nanocrystal diameter. Reduced thermal conductivity is beneficial because it allows higher localised temperatures to be achieved in porous silicon using electrically resistive heating.

Porous silicon also exhibits a higher electrical resistivity relative to bulk crystalline silicon, localised heating for reliable bonding is achievable for lower electrical energy inputs compared to that required for bulk silicon components devoid of porous silicon. This provides a benefit that the components do not need to be heated to as high a temperature as would be required for bulk silicon components devoid of the porous material and results in reduced thermal stresses to the bonded product.

Preferably step (b) comprises the step of melting the nanomaterial.

Preferably the method comprises the further step of locating the porous silicon in an inert atmosphere prior to or during step (b). The inert atmosphere may comprise either nitrogen or a nobel gas; the nobel gas may be selected from argon and helium.

Advantageously step (b) is performed at a pressure less than 1 mbar, more advantageously step (b) is performed at pressures less than 10$^{-2}$ mbar, yet more advantageously step (b) is performed at pressures less than 10$^{-4}$ mbar.

Preferably the bonded product is a pharmaceutical product and the method further comprises the step of forming and arranging the components in such a manner that, once bonded, they are suitable for oral consumption by a human or animal.

Advantageously the bonded product is a pharmaceutical product and the method comprises the further step of forming and arranging the components in such a manner that, once bonded, they are suitable for administration to a human or animal in the form of a suppository.

Preferably the bonded product is an implant and the method comprises the further step of forming and arranging the components in such a manner that, once bonded, they are suitable for implantation into an animal or human body; more preferably the bonding is performed in such a manner that, when the components are implanted, a hermetic seal against animal or human body fluids is formed between the bonded components.

Advantageously the method comprises the further step of forming an integrated circuit in one of the components, more advantageously the integrated circuit is a silicon integrated circuit.

Preferably the method further comprises the step of removing any oxygen atoms bonded to the nanomaterial; more preferably the oxygen removing step comprises the step of treating the nanomaterial with hydrofluoric acid.

Advantageously step (b) comprises the step of heating the nanomaterial by radiating the nanomaterial with laser radiation.

At least one of the components may be a micromachined component.

The method is of particular value in the fabrication of bonded products comprising micromachined components. This is because micromachined components have a relatively low mass and are therefore particularly vulnerable to thermal shock, and because the method may be performed at relatively low temperatures.

According to a second aspect, the invention provides a bonded product comprising fused nanomaterial characterised in that at least part of the fused nanomaterial forms a bond between a first part of the bonded product and a second part of the bonded product.

Preferably the bonded product comprises a semiconductor material, more preferably the semiconductor comprises silicon; yet more preferably the silicon comprises bulk crystalline silicon and/or polycrystalline silicon and/or porous silicon.

Advantageously the fused nanomaterial comprises fused nanocrystalline silicon, more advantageously the fused nanomaterial comprises fused porous silicon.

Preferably the bonded product has a form and composition such that it is suitable for oral consumption by an animal or human body.

Advantageously the bonded product has a form and composition such that it is suitable for inclusion in a suppository.

Preferably the bonded product has a form and composition such that it is suitable for implantation in an animal or human body; more preferably at least part of the fused nanomaterial is arranged such that, when implanted, a hermetic seal against animal or human body fluids is formed between the first and second parts of the bonded product.

The bonded product may further comprise a micromachined component. The bonded product may comprise an integrated circuit.

The method is of particular value in the fabrication of bonded products comprising integrated circuits. This is because integrated circuits have delicate circuitry that is particularly vulnerable to thermal shock, and because the method may be performed at relatively low temperatures.

According to a third aspect, the invention provides a bonding material comprising a nanomaterial.

Preferably the bonding material comprises a semiconducting nanomaterial; more preferably the semiconducting material comprises silicon; yet more preferably the silicon comprises porous silicon; even more preferably the porous silicon comprises comprises crushed porous silicon.

Advantageously the nanomaterial comprises a powder.

Preferably the bonding material further comprises a liquid component, the nanomaterial being distributed through the liquid component; yet more preferably the bonding material is in the form of a paste.

In order that the invention might be more fully understood, embodiments thereof will now be described, by way of example only, with reference to accompanying drawings, in which:

FIG. 1 is an illustration of a bonded product according to the invention;

Figure 4:
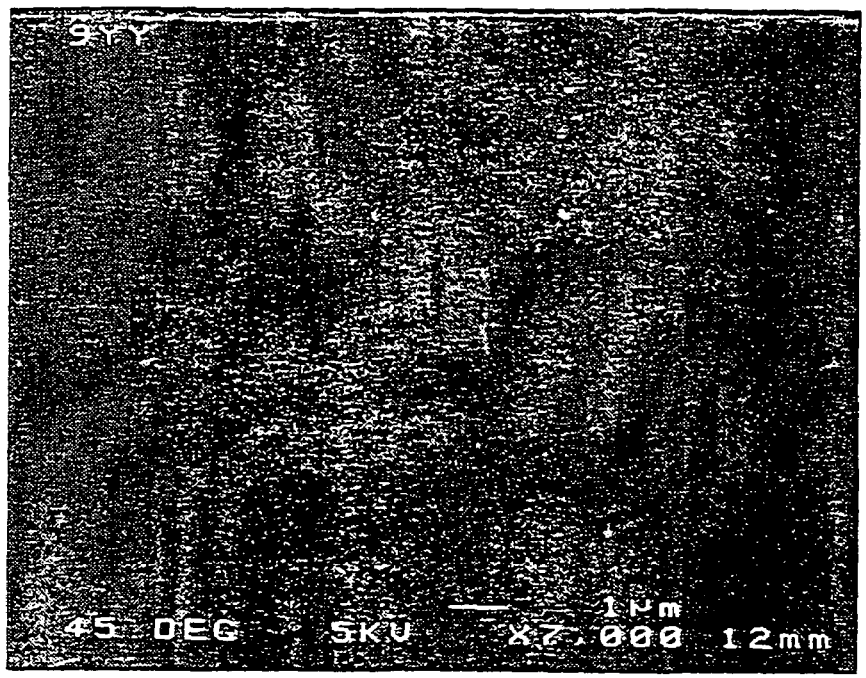
Figure 6:

FIGS. 3a, b, and c are a schematic diagrams illustrating the formation of a bonded product comprising porous silicon;

FIG. 4 shows a sample of porous silicon, prior to heating to form a weld;

FIG. 5 shows micrographs of weld zones generated by welding according to the invention; and FIG. 6 shows a sample of fused nanocrystalline silicon located in the weld zone shown in FIG. 5.

FIG. 1 shows a first bonded product 110, according to the invention, comprising a first component 120 and a second component 130 that are bonded together by a fused nanomaterial 140. The bonded product 110 is a container and has a cavity 150 that is enclosed by the first and second components 120, 130. The first and second components 120, 130 of the are formed from bulk crystalline silicon; the fused nanomaterial 140 is formed from fused porous silicon.

Figure 2A:
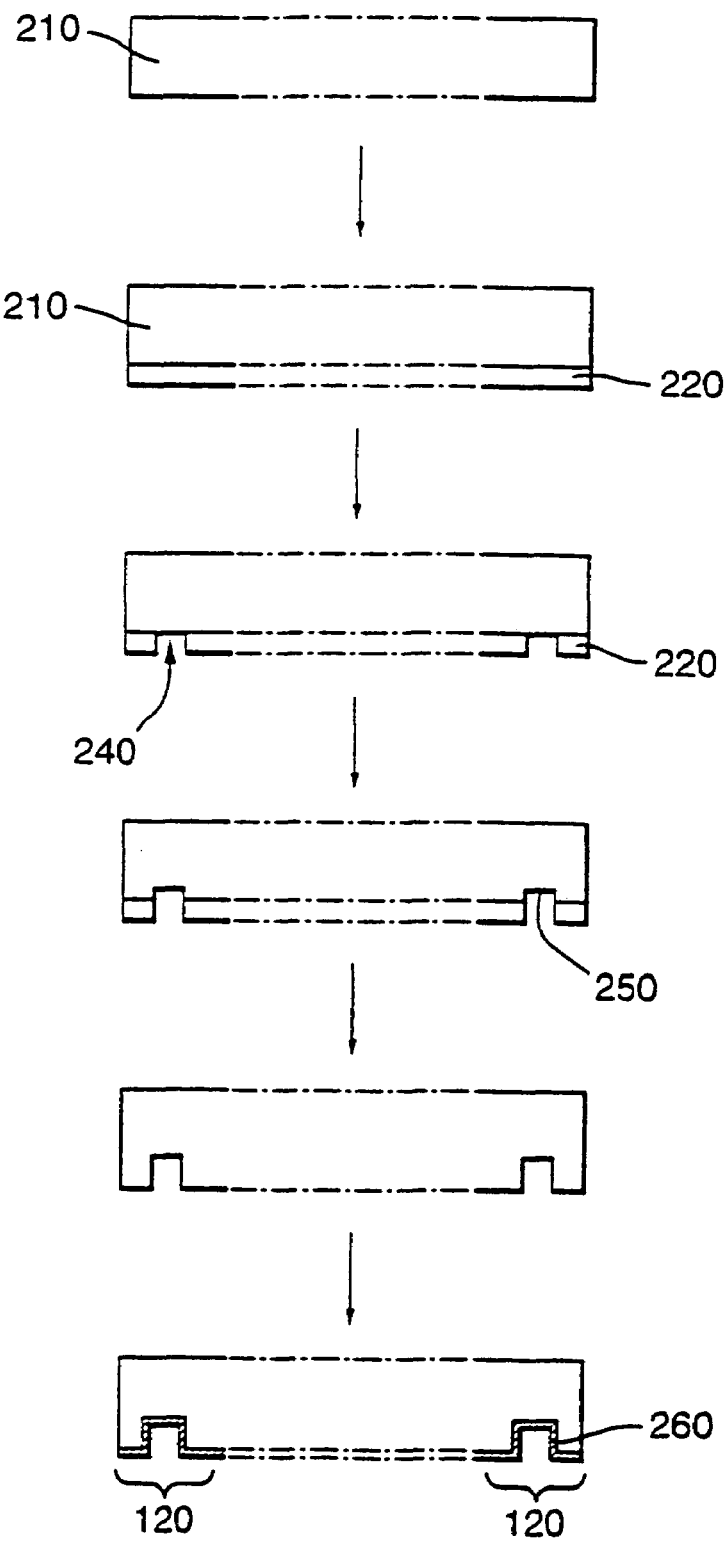
FIGS. 2a and 2b are schematic diagrams of processing steps required to fabricate the product shown in FIG. 1.
Figure 2B:
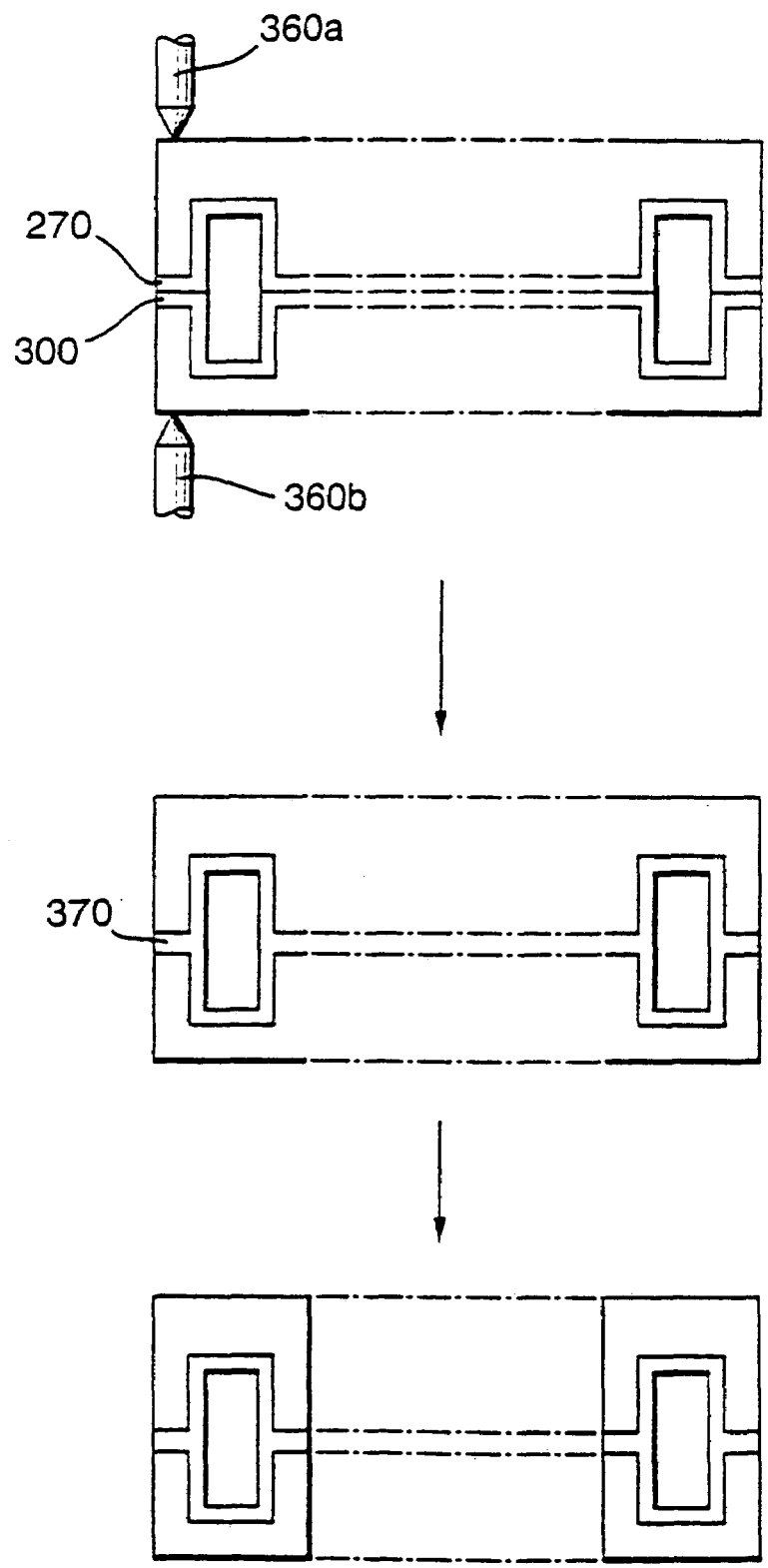

FIG. 2 shows the processing steps involved in fabricating the first bonded product 110 by a method according to the invention. FIG. 2a shows the steps involved in fabricating the first and second components 120, 130. FIG. 2b shows how these two components 120, 130 are bonded together. A 1 □m thick silicon nitride layer 220 is deposited onto a first silicon wafer to provide, when patterned, a stencil foranisotropic etching of cavities into the first wafer 210. The first silicon wafer comprises bulk crystalline silicon. An organic photosensitive resist is deposited or spun onto the silicon nitride layer 220, photolithographically exposed and developed. The first wafer 210 and its associated layer 220 are then reactively ion etched to provide etch windows such as 240 through the layer 220. The organic resist is then stripped off using oxygen plasma ashing or acetone.

The first wafer 210 is then immersed in a mixture of potassium hydroxide solution and ethanol to isotropically etch a first set of recesses 250 into the wafer 210. The potassium hydroxide etched wafer 210 is then exposed to ion milling to remove remnants of the silicon nitride layer 220. The first wafer 210 is then anodised in aqueous HF, as described in U.S. Pat. No. 5,348,618, to form a layer 260 of porous silicon. The porous silicon comprises nanocrystalline silicon. The porosity of the layer may be in the range 30% to 90%, and the thickness of the layer may be in the range 100 nm to 10 μm. The processed first wafer 210 comprises a multiplicity of first components 120 each having a first recess 250 and a first porous silicon region 260. In other words the processed wafer 210 comprises a multiplicity of first components 120, each component being joined to its neighbouring component or components.

The same steps are applied to a second wafer 280 to yield a multiplicity of second components 130; each component 130 having a second recess 290 and a second porous silicon region 300.

The porosification of the first and second wafers results in porosification of the whole surface that defines each cavity 250 and also results in porsification of the surfaces that define the lips 270, 300 located at the periphery of each cavity. The reason for both the lips 270, 300 and cavity defining surfaces being porosified in this way is that these surfaces are all exposed to the electrochemical etching process described in U.S. Pat. No. 5,348,618. For certain applications it may be desirable to prevent porosification in the cavities 250, in which case the cavity 250 surfaces would be protected by an HF resistant mask such as silicon carbide.

The processed wafers 210, 280 are dipped in hydrofluoric acid (HF) to remove any native oxide and are then promptly bought together so that their lips 270, 300 are mutually in contact to provide an assembly indicated by 350. The assembly 350 is then placed in an evacuated chamber at less than 1 mBar pressure and held between two spring-loaded pointed graphite electrodes 360a, 360b. A current of 2 Amperes is then passed through the assembly 350 from one of the electrodes 360 to the other; a potential difference of approximately 60 volts for a period of 10 seconds is applied between the electrodes 360a, 360b to force this 2 Ampere current through the assembly 350 to create a weld between the processed wafers 210 and 280. The island regions 270, 300 are fused by the electric current, resulting in the formation of a first fused porous silicon region 370. The assembly 350 is progressively stepped between the electrodes 360 a, b to form a substantially continuous weld between the wafers 210, 280.

The assembly 350 is then removed from the evacuated chamber, diamond scribed and diced to yield a multiplicity of first bonded products 110. The first and second components 120, 130 are bonded together, in the method described above, when the processed wafers 210, 280 are welded together; the fused porous silicon also being formed by the welding process. The bonded product 110 is a sealed container.

Such sealed containers may be used for a number of biological applications. Such applications partly stem from the fact that porous and polycrystalline silicon exhibit biocompatible and resorbable properties, as disclosed in GB 9808052.6. A material is biocompatible if, when implanted to a human or animal body, tissue forms a bond with the material. A material is resorbable if, when implanted into an animal or human body, the material is corroded by the ambient body fluids and the corrosion products are non toxic and readily excreted.

The bonded product 110 may be adapted to make it biocompatible by porosifying the external surfaces of the product 110 or by depositing a layer of polycrystalline silicon to the external surfaces, as described in GB 9808052.6. A bonded product that has been adapted in this way may, for example, be implanted in a human body and bonded to human bone.

Alternatively the first bonded product 110 may be adapted for drug delivery by porosifying at least part of the product to form a barrier. The porous barrier must extend from the cavity 150 to the exterior of the product 110. A product that has been adapted in this way may be used for drug delivery by introducing a drug into the container. The drug may be introduced prior to the bonding process, for example by dissolving the drug in a suitable solvent and introducing the resulting solution into the first and/or second recesses 290, 250 by capillary action. Once present in a human or animal body the body fluids corrode the porous barrier, resulting in the release of the drug. For the purposes of this specification the term "body fluids" is taken to include blood, as well as fluids present in the gastrointestinal, anorectal, and vaginal environments.

The first bonded product 110, which has been adapted for drug release in this way, may be introduced into the human or animal body in a number of ways. The bonded product 110 may be administered orally, in which case the container may be coated in an excipient coating to make the product 110 more palatable to the human or animal. The bonded product 110 may also be introduced in the form of a suppository and may be surrounded by a suitable coating that facilitated insertion of the product 110 into the animal or human. Finally the bonded product may be implanted, for example by surgery, into the animal or human.

The first bonded product 110 may further comprise an integrated circuit formed in one of the components 120, 130 prior to the bonding process. Such an integrated circuit may be used in the control of drug release; for example controlling the rate of release.

There are a number of ways of fabricating a container, suitable for drug release, comprising a bonded product according to the invention. As described above the container may have a barrier comprising porous silicon that separates the drug from the exterior of the container. Alternatively the barrier may comprise polycrystalline silicon.

The barrier to drug release may be formed before or after the bonding process. FIG. 3 illustrates a fabrication process by which the barrier may be fabricated before the bonding process. FIG. 3a shows the steps by which a third wafer fragment 410 may be processed, FIG. 3b shows the steps by which a fourth wafer fragment 510 may be processed, and FIG. 3c shows the step involved in bonding the third and fourth fragments 410 and 510. The fragments 410 and 510 comprise bulk crystalline silicon. The fragments 410, 510 are anisotropically etched to yield the structures 420, 520 respectively, and are then anodised to yield the third and fourth components 430 and 530. The third component 430 comprises a porous silicon barrier 440 and also comprises a third porous silicon region 450. The fourth component 530 comprises a fourth porous silicon region 540. The third and fourth components are bonded together by abutting the porous silicon regions 450 and 540 and passing an electric current between the points c and d to yield a container 570 having a fused porous silicon region 560 and a barrier 440.

Nanocrystalline silicon may be formed by anodising bulk crystalline silicon to form porous silicon. The nanocrystalline silicon may be scraped from the surface of the bulk crystalline silicon to form a powder. The powder may be used as a bonding material for bonding bulk crystalline silicon components together. The powder may be applied to the interface between two components and a current passed through the powder. Since the powder comprises nanocrystalline silicon it will melt at a lower temperature than the bulk silicon components to weld the components together. The use of a powder is advantageous since it may be applied to components in situations when it is not convenient to perform anodisation; for example it may be applied when the component is not easily anodised: The nanocrystalline silicon powder may be combined with a liquid or solid material to make the powder easier to handle. For example the liquid or solid material may assist in the application of the nanocrystalline silicon to the component to be welded; either by enhancing the cohesion of the nanocrystalline powder or by enhancing the adherence of the powder to the components that will be welded.

FIG. 4 shows a sample of porous silicon having a porosity of 50% and layer thickness of 7 µm. The pores are too small to be seen at the magnification of the image (×7000). The sample shown in FIG. 4 was spot welded in an Edwards E306 Vacuum Evapourator unit at $10^{-5}$ torr. The weld was made by placing the sample in contact with a corresponding sample of porous silicon; a current of 2 amps was then passed through the abutted porous regions for a period of 10 seconds. The sample area for each porous silicon sample was approximately 1 cm². FIG. 5 shows the two samples after the current has been passed. The welded samples are broken apart and FIG. 5 shows each sample in the region of the weld. FIG. 6 shows part of one of the samples in the region of the weld; it shows a sphere of fused nanocrystalline silicon. The sphere is formed as a result of the porous silicon becoming molten, the surface tension of the silicon causing the silicon to adopt the shape of a sphere. The sphere is sufficiently close, but not at the site of, the weld so that melting of the silicon occurred without bonding.

A control experiment was also performed in which two bulk crystalline silicon segments having polished front faces and an approximate surface area of 1 cm² were abutted and heated in the same manner as described above. A current of 2 amps was passed for a period of 60 seconds. Once current flow had ceased the samples were separated and the surfaces examined by a XSEM at magnification of ×7000. No change in surface roughness was observed indicating that no weld had been formed.

Attempts to weld bulk silicon components devoid of abutting porous silicon layers using the apparatus 500 have proved unsuccessful because a sufficiently high interface temperature to cause fusion melting has not been possible to achieve.

Although welding of silicon components together at porous silicon layer interfaces according to the invention is described above, components of materials other than silicon, particularly semiconductor materials, can be welded together in a similar manner, for example germanium and silicon carbide. Moreover, porous layers which are welded together according to the invention need not be of similar chemical species to their associated components, for example porous silicon layers may be formed onto germanium components which are subsequently welding together according to the invention.

The invention claimed is:

1. A method of fabricating a bonded product comprising at least two components that are bonded together, the method comprising the steps of:
   (a) bringing the components together; and
   (b) heating the components;
   wherein at least one of the components comprises a nanomaterial, the nanomaterial comprising non-porous silicon, and wherein steps (a) and (b) are performed in such a manner that the components are bonded together by melting at least part of the nanomaterial.

2. A method according to claim 1 wherein at least one of the components comprises bulk crystalline silicon.

3. A method according to claim 1 wherein at least one of the components comprises silica.

4. A method according to claim 1 wherein the nanomaterial comprises nanocrystals having diameters in the range 1 to 20 nm.

5. A method according to claim 1 wherein the nanomaterial comprises polycrystalline silicon.

6. A method according to claim 1 wherein step (b) is carried out at an external pressure of less than 1 mbar.

7. A method according to claim 1 wherein the method further comprises the step of removing any oxygen atoms bonded to the non-porous silicon.

8. A method according to claim 7 wherein the oxygen removing step comprises the step of treating the non-porous silicon with hydrofluoric acid.

9. A method according to claim 1 wherein the method comprises the further step of forming an integrated circuit in one of the components.

10. A method according to claim 1 wherein at least one of the components is a micromachined component.

* * * * *